US012660506B2

(12) United States Patent
Wallinder

(10) Patent No.: US 12,660,506 B2
(45) Date of Patent: Jun. 16, 2026

(54) PIEZOELECTRIC RESONATOR, A PIEZOELECTRIC MATERIAL FOR A PIEZOELECTRIC RESONATOR, AND A METHOD FOR MANUFACTURING A PIEZOELECTRIC RESONATOR

(71) Applicant: ATTANA AB, Sollentuna (SE)

(72) Inventor: Daniel Wallinder, Stockholm (SE)

(73) Assignee: ATTANA AB, Stockholm (SE)

( * ) Notice: Subject to any disclaimer, the term of this patent is extended or adjusted under 35 U.S.C. 154(b) by 311 days.

(21) Appl. No.: 18/026,934

(22) PCT Filed: Sep. 22, 2021

(86) PCT No.: PCT/EP2021/076093
§ 371 (c)(1),
(2) Date: Mar. 17, 2023

(87) PCT Pub. No.: WO2022/063843
PCT Pub. Date: Mar. 31, 2022

(65) Prior Publication Data
US 2023/0336137 A1 Oct. 19, 2023

(30) Foreign Application Priority Data
Sep. 23, 2020 (GB) ...................................... 2015038

(51) Int. Cl.
*H10N 30/853* (2023.01)
*G01N 29/02* (2006.01)
(Continued)

(52) U.S. Cl.
CPC ......... *H10N 30/853* (2023.02); *G01N 29/022* (2013.01); *G01N 29/041* (2013.01); *H03H 3/02* (2013.01); *H10N 30/30* (2023.02)

(58) Field of Classification Search
CPC ...... H03H 3/02; G01N 29/041; G01N 29/036; G01N 29/32; G01N 29/222; G01N 29/022;
(Continued)

(56) References Cited

U.S. PATENT DOCUMENTS

| | | | |
|---|---|---|---|
| 2011/0203367 A1* | 8/2011 | Huang ............... | G01N 33/4905 |
| | | | 73/32 R |
| 2013/0009519 A1 | 1/2013 | Shibata et al. | |

(Continued)

FOREIGN PATENT DOCUMENTS

| | | | |
|---|---|---|---|
| JP | 10315465 A | * | 12/1998 |
| WO | 2004057319 A1 | | 7/2004 |
| WO | 2008132487 A1 | | 11/2008 |

OTHER PUBLICATIONS

International Search Report and Written Opinion received in PCT/EP2021/076093 mailed Jan. 14, 2022, 8 pages.

*Primary Examiner* — Quan Tra
*Assistant Examiner* — Anh-Quan Tra
(74) *Attorney, Agent, or Firm* — Meunier Carlin & Curfman LLC

(57) ABSTRACT

The present disclosure relates to piezoelectric resonator, a piezoelectric material for a piezoelectric resonator, and a method for manufacturing a piezoelectric resonator. In particular, it relates to piezoelectric resonator comprising a piezoelectric material, where the piezoelectric material is configured to have an improved shear wave velocity.

24 Claims, 9 Drawing Sheets

(51) Int. Cl.
  *G01N 29/04*     (2006.01)
  *H03H 3/02*     (2006.01)
  *H10N 30/30*     (2023.01)

(58) Field of Classification Search
  CPC ... G01N 2291/0256; G01N 2291/0426; G01N
      2291/0255; H10N 30/04; H10N 30/853;
                  H10N 30/30
  See application file for complete search history.

(56)        References Cited

U.S. PATENT DOCUMENTS

| | | | |
|---|---|---|---|
| 2016/0372653 A1* | 12/2016 | Umeda | C23C 14/3464 |
| 2017/0093336 A1* | 3/2017 | Kawashima | H03H 9/1021 |
| 2017/0302242 A1* | 10/2017 | Noto | H03H 3/04 |
| 2019/0051525 A1 | 2/2019 | Akiyama | |
| 2019/0361045 A1* | 11/2019 | Abdolvand | G01P 15/125 |
| 2021/0126183 A1* | 4/2021 | Chen | H10N 30/853 |
| 2022/0037583 A1* | 2/2022 | Koutsaroff | C04B 35/581 |

* cited by examiner

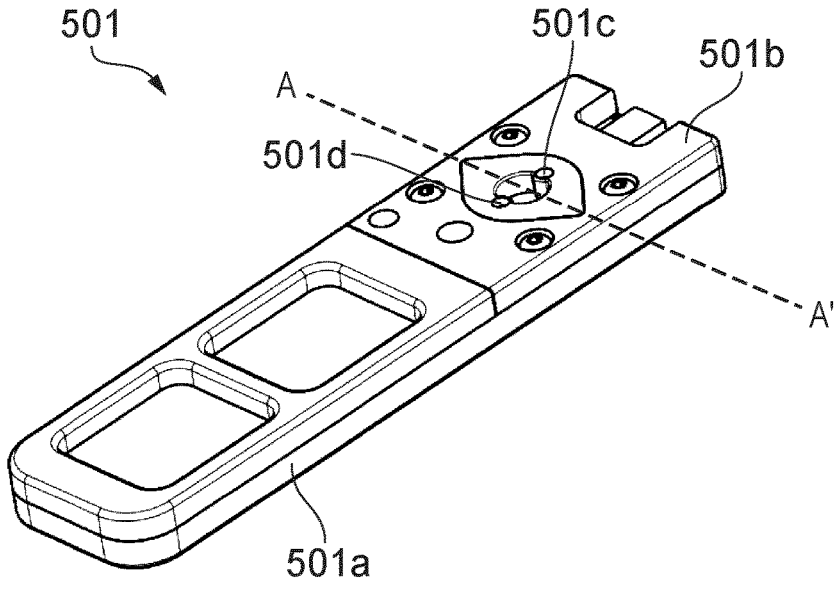
FIG. 5b(i)
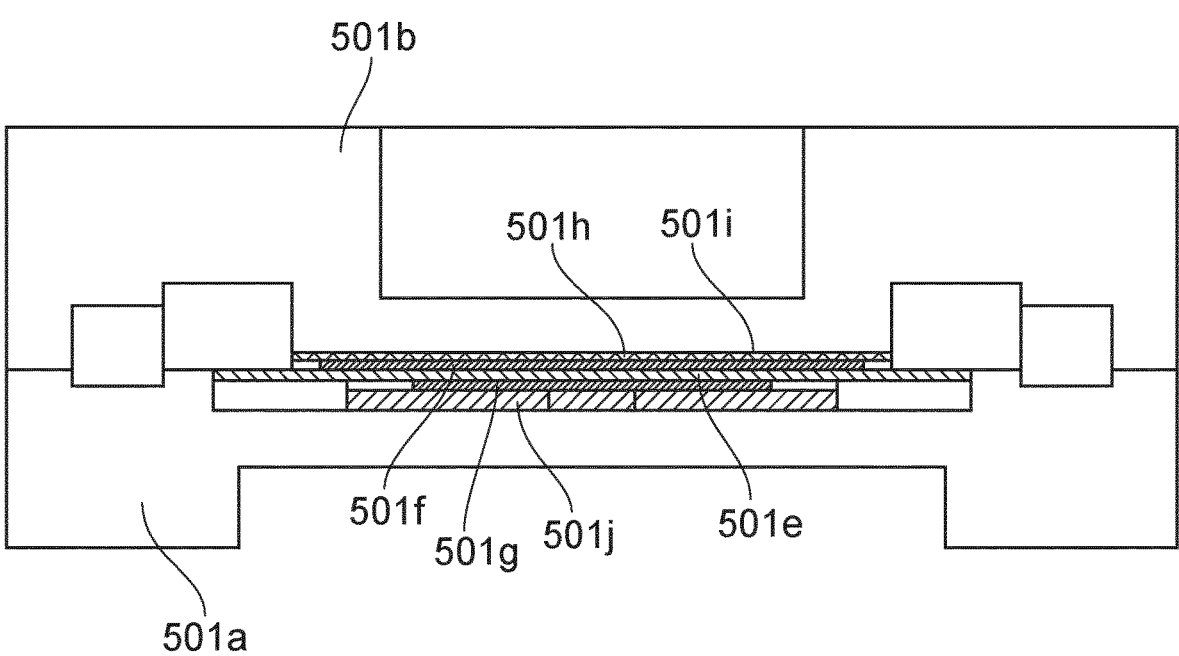
FIG. 5b(ii)

PIEZOELECTRIC RESONATOR, A PIEZOELECTRIC MATERIAL FOR A PIEZOELECTRIC RESONATOR, AND A METHOD FOR MANUFACTURING A PIEZOELECTRIC RESONATOR

FIELD OF DISCLOSURE

The present disclosure relates to piezoelectric resonator, a piezoelectric material for a piezoelectric resonator, and a method for manufacturing a piezoelectric resonator. In particular, it relates to piezoelectric resonator comprising a piezoelectric material, where the piezoelectric material is configured to have an improved shear wave velocity which in turn enables an improvement in the quality factor and resonant frequency of the piezoelectric material.

BACKGROUND

Piezoelectric resonators are used in different types of resonating systems. One common application of piezoelectric resonators is in mass-sensitive chemical sensors. A mass-sensitive chemical sensor can be defined as any device that allows for measurement of a property that scales proportionally to mass associated with or bound to a sensing surface of that device. Several such sensor techniques can be utilised, such as evanescent wave-based sensors, e.g. surface plasmon resonance (SPR, which is capable of registering mass changes by the associated change in refractive index at the surface), optical waveguides (also dependent on refractive index changes associated with mass binding events), optical diffraction, optical interference, ellipsometry and acoustic wave devices (for example quartz crystal micro balances (QCMs)). These sensor approaches are well established in the art (see, for example, *Biomolecular Sensors*, Gizeli and Lowe. Taylor and Francis, London; 2002) and these types of instruments can be used for studies of chemical reactions in situ and for detection of certain molecules in a sample. WO 2004/057319, describes a QCM sensor element and associated apparatus of a sensor instrument. In mass-sensitive sensor applications, the sensitivity of the sensor depends on the resonant frequency. The Q factor is indicative of the frequency stability of the resonator.

Another common application of piezoelectric resonators is in oscillator circuits. Oscillator circuits can be used in, for example, communication applications for providing clock signals at a particular desired frequency. The performance of a piezoelectric resonator is dependent on its resonant frequency and its quality, or Q factor. The resonant frequency determines the desired frequency of oscillation in oscillator circuits. The Q factor in communication circuits is indicative of the selectivity of the circuit for a given frequency range with a high Q factor being beneficial, in some communication applications, for selecting a narrow frequency range.

Conventionally, optimising the performance of a piezoelectric resonator is limited due to trade-offs, such as the trade-off between the thickness of the quartz crystal plate and resonant frequency, and the trade-off between the Q factor and resonant frequency. Therefore, there is a need to modify the characteristics of the piezoelectric resonator to reduce or completely avoid the limitations imposed by these trade-offs on the performance of the resonator.

SUMMARY OF DISCLOSURE

The present disclosure relates to piezoelectric resonator, a piezoelectric material for a piezoelectric resonator, and a method for manufacturing a piezoelectric resonator. In particular, it relates to piezoelectric resonator comprising a piezoelectric material, where the piezoelectric material is configured to have an improved shear wave velocity.

The proposed piezoelectric material comprises a reduced level of hydrogen content. The inventors have recognised that outgassing hydrogen from the piezoelectric material enables an increase in shear wave velocity in the piezoelectric material. This in turn results in an improvement in both the resonant frequency and quality factor of a resonator comprising the modified piezoelectric material. In mass-sensitive sensor applications, for example, an improvement in resonant frequency results in improved sensitivity of the sensor. An improvement in the quality factor ensures improved frequency stability of the resonator comprising the proposed piezoelectric material. Furthermore, as the thickness of the piezoelectric material no longer needs to be reduced to increase the resonant frequency of the resonator, the mechanical stability of the resonator is also improved.

The proposed piezoelectric material of the present invention has the advantage that it can be used to improve the resonant frequency and the quality factor of a resonator without requiring a trade-off in the mechanical stability of the resonator. That is, the proposed piezoelectric material does not require a reduction in its thickness in order to achieve an improvement in the resonant frequency of the resonator. Furthermore, the quality factor of the resonator comprising the proposed piezoelectric material increases with the resonant frequency of the resonator. The inventors have recognised the factors affecting the resonant frequency of a piezoelectric resonator and have proposed a modification to the characteristics of the piezoelectric material accordingly, in order to improve the resonant frequency.

According to a first aspect of this disclosure, there is provided a piezoelectric resonator comprising a piezoelectric material, wherein the piezoelectric material is configured to have a reduced hydrogen content for increasing the shear wave velocity of the piezoelectric material.

According to a second aspect of this disclosure, there is provided a mass-sensitive chemical sensor comprising the above-mentioned piezoelectric resonator.

According to a third aspect of this disclosure, there is provided a piezoelectric sensor element for chemical analysis of a fluid sample, the sensor element comprising the above-mentioned mass-sensitive chemical sensor and wherein the sensor element further comprises a sample chamber being configured to receive a fluid sample and further configured to facilitate contact of a fluid sample with the mass-sensitive chemical sensor; and one or more flow channels in fluid connection with the sample chamber for directing the flow of the fluid sample to and from the sample chamber.

According to a fourth aspect of this disclosure, there is provided a piezoelectric sensor system for chemical analysis of a fluid sample, the piezoelectric sensor system comprising the above-mentioned piezoelectric sensor element; a sample insertion unit for introducing the fluid sample to the sensor element; a signal source for providing electric signals to the piezoelectric sensor element for generation of an oscillating motion of the piezoelectric resonator in the piezoelectric sensor element; and a processing unit for measuring the resonant frequency of the piezoelectric resonator and for generating an output signal representing the said resonant frequency.

According to a further aspect of this disclosure, an oscillator circuit is provided for generating a clock signal, the oscillator circuit comprising a piezoelectric resonator according to the first aspect.

According to a further aspect of this disclosure, there is provided a method for manufacturing a piezoelectric resonator, the method comprising: providing a piezoelectric material of a predetermined thickness; and removing hydrogen from the piezoelectric material for increasing the shear wave velocity of the piezoelectric material.

Further features of the disclosure are defined in the appended claims.

BRIEF DESCRIPTION OF THE DRAWINGS

The disclosure will now be described, by way of non-limiting examples, with reference to the accompanying drawings, in which:

FIG. 3b shows empirical monitoring data of the release of hydrogen from heated quartz crystal samples during outgassing as enabled by the use of a TD system as shown in FIG. 3a;

DETAILED DESCRIPTION

The present disclosure relates to piezoelectric resonator, a piezoelectric material for a piezoelectric resonator, and a method for manufacturing a piezoelectric resonator. In particular, it relates to piezoelectric resonator comprising a piezoelectric material, where the piezoelectric material is configured to have an improved shear wave velocity.

A piezoelectric resonator comprising the proposed piezoelectric material can be used, for example, in mass sensitive sensor applications for characterising biomolecular binding. The proposed piezoelectric material, when used in a piezoelectric resonator, enables an improved resonant frequency, without requiring a reduction in its thickness, and a reduction in the quality, or Q factor of the resonator. In this way, a piezoelectric resonator comprising the proposed piezoelectric material has improved performance and mechanical stability.

Figure 1A:
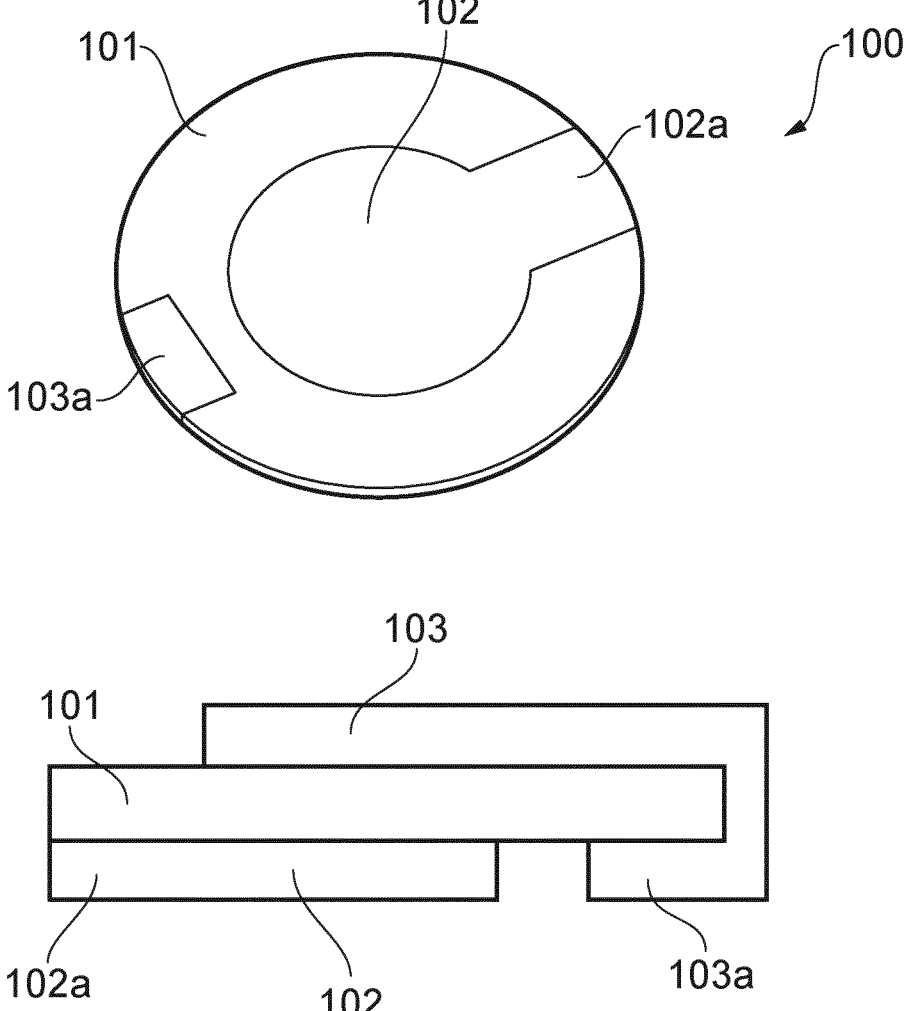
FIG. 1a shows an example representation of a piezoelectric resonator 100 according to an embodiment of this invention.

Piezoelectric resonators comprise a piezoelectric material placed between two electrodes. A piezoelectric material is a crystalline material which deforms upon application of an electrical potential. FIG. 1a shows an example representation of such a piezoelectric resonator 100. A piezoelectric material 101, such as a quartz crystal plate, is placed between two electrodes 102 and 103. In this example, the quartz crystal plate 101 is partially covered by the electrode material on both sides. The electrodes 102, 103 are normally made from gold, but other suitable metals may be used.

In the example of FIG. 1a, the electrode 103 includes a portion 103a that extends to the periphery of the crystal plate 101, around the edge of the crystal plate, and up the opposing side of the crystal plate 101. As such, the contact area of the portion 103a of the electrode 103 is positioned on the opposite side of the crystal plate 101 to the main portion of the electrode 103. The portion 103a is also on the same side as the electrode 102. This makes it possible to contact both electrodes 102, 103 from one side of the crystal plate 101. However, the electrodes 102, 103 can be contacted electrically from either side of the crystal plate.

In a practical implementation of the resonator of FIG. 1a, the electrodes 102, 103 are connected to an AC-potential. The quartz crystal plate 101 begins to oscillate if the frequency of the AC-potential is close to the resonant frequency, $f_o$, of the oscillation mode for the quartz crystal plate 101. The resultant oscillations of the quartz crystal can be expressed as bulk mode, or surface acoustic waves traveling in the crystal, depending on the application and resonant frequency. The resonant frequency, $f_o$, of the quartz crystal plate 101 is a function of many parameters, such as temperature, pressure, cut angle of the crystal, mechanical stress and thickness of the crystal plate. The resonant frequency, $f_o$, of the quartz crystal plate 101, as also seen in Equation [1] below, is directly proportional to the shear wave velocity, $v_o$, in quartz and inversely proportional to the thickness, t, of the quartz crystal plate 101:

$$f_o = \frac{v_o}{2t_o} \qquad [1]$$

Figure 1B:
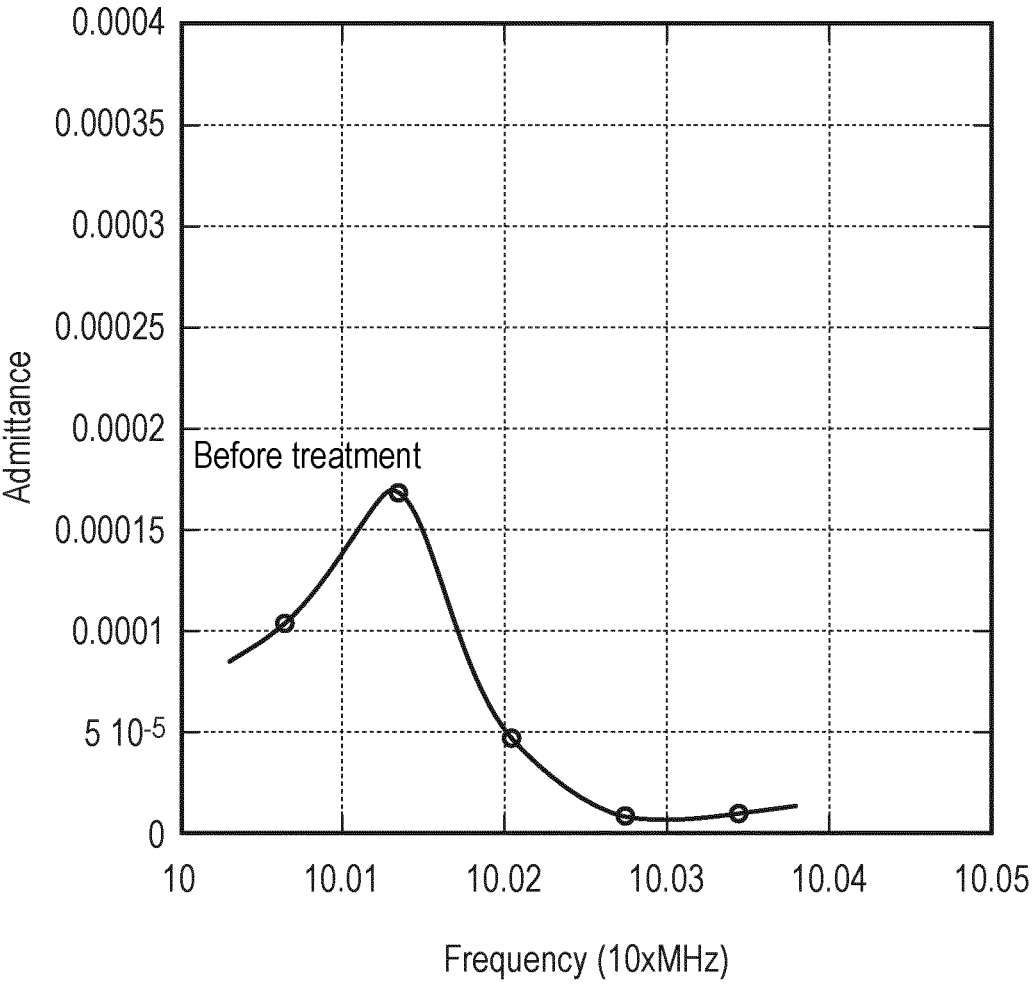
FIG. 1b is a graph of the admittance spectrum for a conventional 10 MHz quartz crystal resonator.

FIG. 1b is a graph of the admittance spectrum for a conventional 10 MHz quartz crystal resonator as measured using a vector network analyser (VNA). As seen in FIG. 1b, the resonant frequency is the frequency at which there is a peak in the admittance of the crystal, in this case, at approximately 10 MHz. The quality factor or Q factor of the resonator is the ratio of the resonant frequency to the frequency bandwidth of the resonant peak. This is typically the full width at half the maximum frequency bandwidth (FWHM) as derived from the graph in FIG. 1b. In this case, the Q factor of the typical 10 MHz quartz crystal is approximately 1320. It must be noted that the Q factor was measured in water, that is, with one side of the crystal exposed to water to simulate the use of the piezoelectric resonator as a quartz crystal microbalance in a liquid environment. The Q factor in air or vacuum for the same crystal resonator would be higher than the Q factor as measured in water.

The resonant frequency, $f_o$, and the Q factor are two key parameters for characterizing the performance of a piezoelectric resonator. In a mass sensitive sensor application, for example, the piezoelectric resonator of FIG. 1a can be used as a Quartz Crystal Microbalance (QCM) to detect biomolecular binding. In particular, a QCM can be used to detect the mass change when biomolecular material is added or removed, for example due to film deposition or desorption, from a surface of the resonator. In such an application the resonant frequency, $f_o$, of the thickness shear mode of the resonator shifts with a change in mass of material on the surface of the resonator. This shift in frequency, $\Delta f$, is given by the Sauerbrey equation [2] below:

$$\Delta f = \frac{2f_o^2 \Delta m}{\rho v A} \qquad [2]$$

where $\Delta f$ is the shift in resonant frequency, $f_o$; $\rho$ the density of quartz; v the shear wave velocity in quartz; A the electrode area and $\Delta m$ is change in surface mass deposition of material on surface of the resonator.

As can be seen from the Sauerbrey equation [2] above, the shift in frequency, $\Delta f$, which is essentially indicative of the mass change, is directly proportional to the square of the resonant frequency, $f_o$. Therefore the higher the resonant frequency, $f_o$, the higher the sensitivity of the QCM to changes in surface mass deposition. In practical implementations, there may be an associated energy loss or dampening the oscillation of crystal. The Q factor can be considered to be indicative of the extent of such dampening, with a higher Q factor indicating lower energy losses and hence improved precision of QCM sensor measurements.

In other applications of a piezoelectric resonator, such as clocks and other resonating systems, a high resonant frequency and high Q factor are desirable for improved performance. These factors enable high clock rates and high frequency stability.

Conventionally, an improvement or increase in resonant frequency, $f_o$, of a piezoelectric resonator is achieved by reducing the thickness of the piezoelectric material. Furthermore, an increase in resonant frequency, $f_o$, is typically accompanied by a reduction in the Q factor of the resonator. However, a reduction in thickness of the piezoelectric material results in reduced mechanical stability of the resonator and a reduction in Q factor is undesirable as this is indicative of a reduction in the frequency stability of the resonator.

The inventors have realised that it is possible to improve the resonant frequency, $f_o$, of a piezoelectric resonator by reducing the hydrogen content in the piezoelectric material. The removed hydrogen could include bonded, adsorbed and/or absorbed hydrogen. The inventors have recognised that by removing hydrogen in a piezoelectric material of a given thickness, the shear wave velocity, v, in the piezoelectric material can be increased. In this case, the removal of hydrogen refers to surface and bulk removal of hydrogen in a piezoelectric material. The removal of hydrogen from the piezoelectric material, in turn, results in an increase in the resonant frequency, $f_o$, which is directly proportional to the shear wave velocity, v, of the piezoelectric material.

Figure 2:
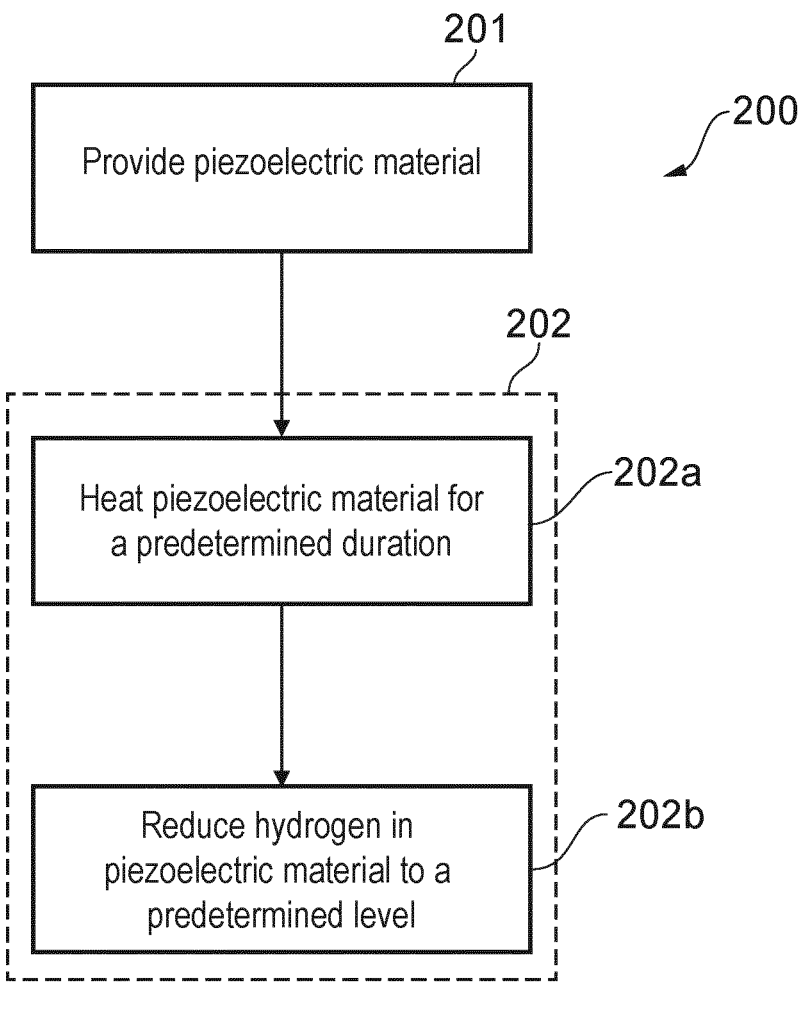
FIG. 2 shows a flow chart for a proposed manufacturing method, according to an embodiment of this disclosure, for reducing the hydrogen content in a piezoelectric material.

FIG. 2 shows a flow chart for the proposed manufacturing method 200, according to an embodiment of this disclosure, for reducing the hydrogen content in a piezoelectric material, such as a quartz crystal plate. As can be seen in FIG. 2, a piezoelectric material or wafer is provided (step 201). The hydrogen in the piezoelectric material is removed using a thermal desorption (TD) process (step 202). In this process, the piezoelectric material is heated in ultra-high vacuum for a predetermined duration (step 202a) to enable outgassing of hydrogen (step 202b).

The TD process may comprise heating the piezoelectric material in a single step for a predetermined duration at a predetermined temperature. Alternatively, the TD process may be a step-wise process, in which the temperature for heating the piezoelectric material is increased gradually at a predetermined rate. In the case of heating the piezoelectric material in a single step, the material is preferably heated at a temperature of around 900° C. to reduce the hydrogen content to a level of approximately 0.05 wt·ppm or less. The duration for heating the piezoelectric material can be predetermined.

A step-wise TD process can serve as a test or calibration process. In this case, hydrogen is removed from a sample piezoelectric material by gradually increasing the temperature of the material at a predetermined rate and monitoring the hydrogen released during outgassing using mass spectroscopy (MS). The use of mass spectroscopy together with TD in the test or calibration process helps to determine the total duration for heating the piezoelectric material in order to achieve a desired, reduced hydrogen content in the piezoelectric material. The step-wise TD process will also be described below with reference to FIG. 3b.

Figure 3A:
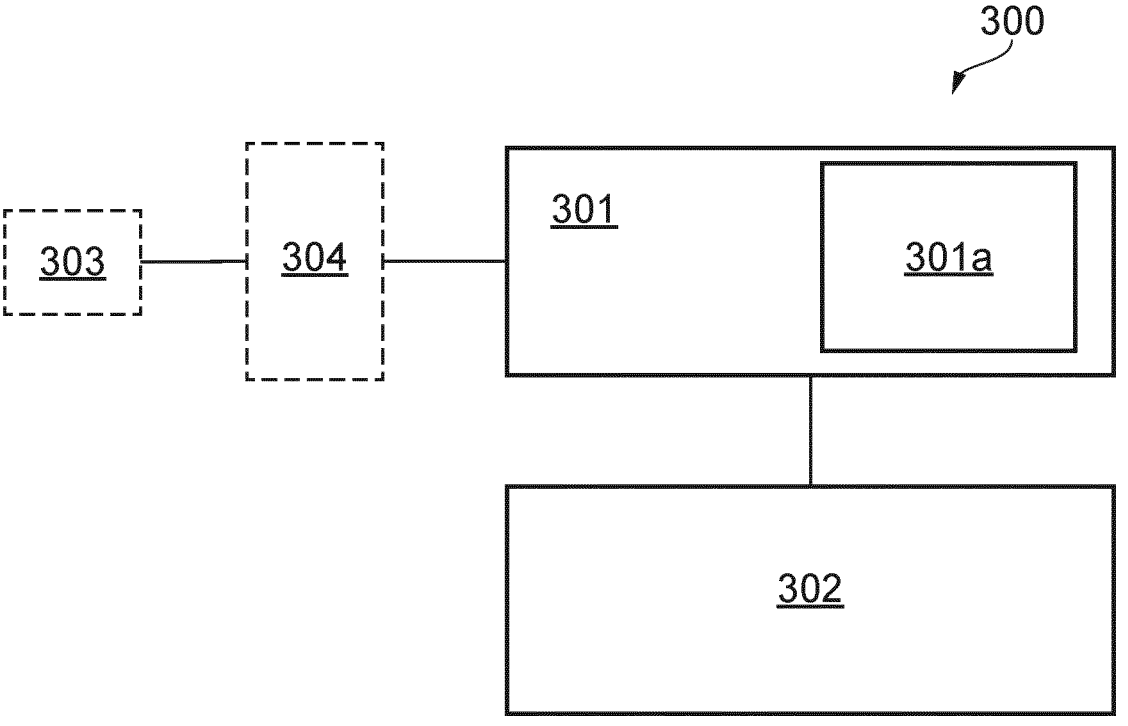
FIG. 3a shows a block diagram of a thermal desorption (TD) system 300 for implementing the method of FIG. 2.

FIG. 3a shows a block diagram of a TD system 300 for implementing the method of FIG. 2. The TD system 300 comprises an ultra-high vacuum sample chamber 301a within an inbuilt furnace 301 or introduction and heating of the piezoelectric material from which hydrogen is to be removed. The system 300 further comprises a gas handling unit 302 for controlling gas flow in and out of the sample chamber 301. The system 300 may optionally comprise a mass spectrometer 303 for analysing the gases released upon heating the piezoelectric material and an ion-pump 304 for released gases.

Figure 3B:
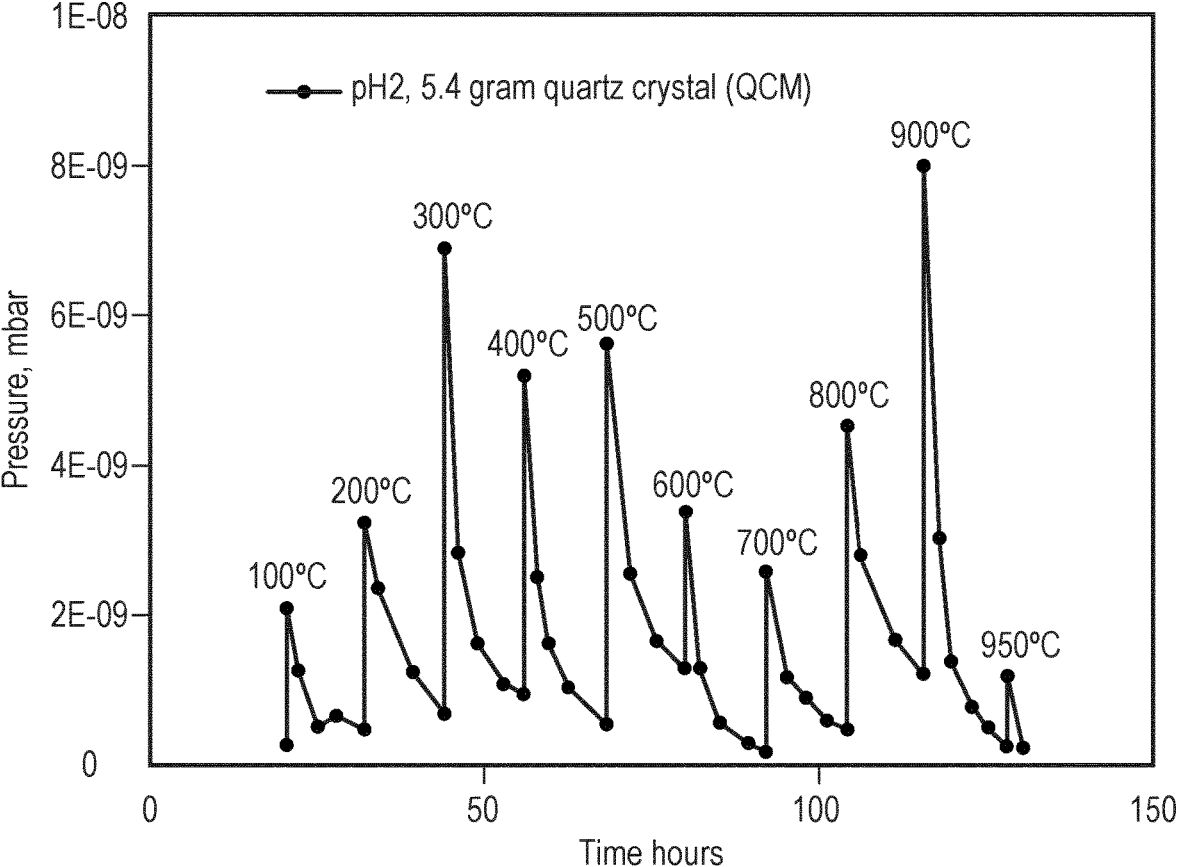

FIG. 3b shows empirical monitoring data of the release of hydrogen from heated quartz crystal samples during outgassing as enabled by the use of a TD system as shown in FIG. 3a. That is, FIG. 3b shows the pressure of gas components during outgassing of heated quartz crystal samples. In this case, the temperature of the furnace comprising the crystal samples is increased in a step-wise manner by 100° C. every hour. In the spectrum of FIG. 3b, the area below the hydrogen curve, together with calibration, gives the amount of hydrogen that was present in the piezoelectric material that has now been outgassed. The initial hydrogen content in the piezoelectric material was determined to be approximately 1.98 wt·ppm. After the out-gassing, the hydrogen content in the piezoelectric material was determined to be less than 0.05 wt·ppm.

Figure 4:
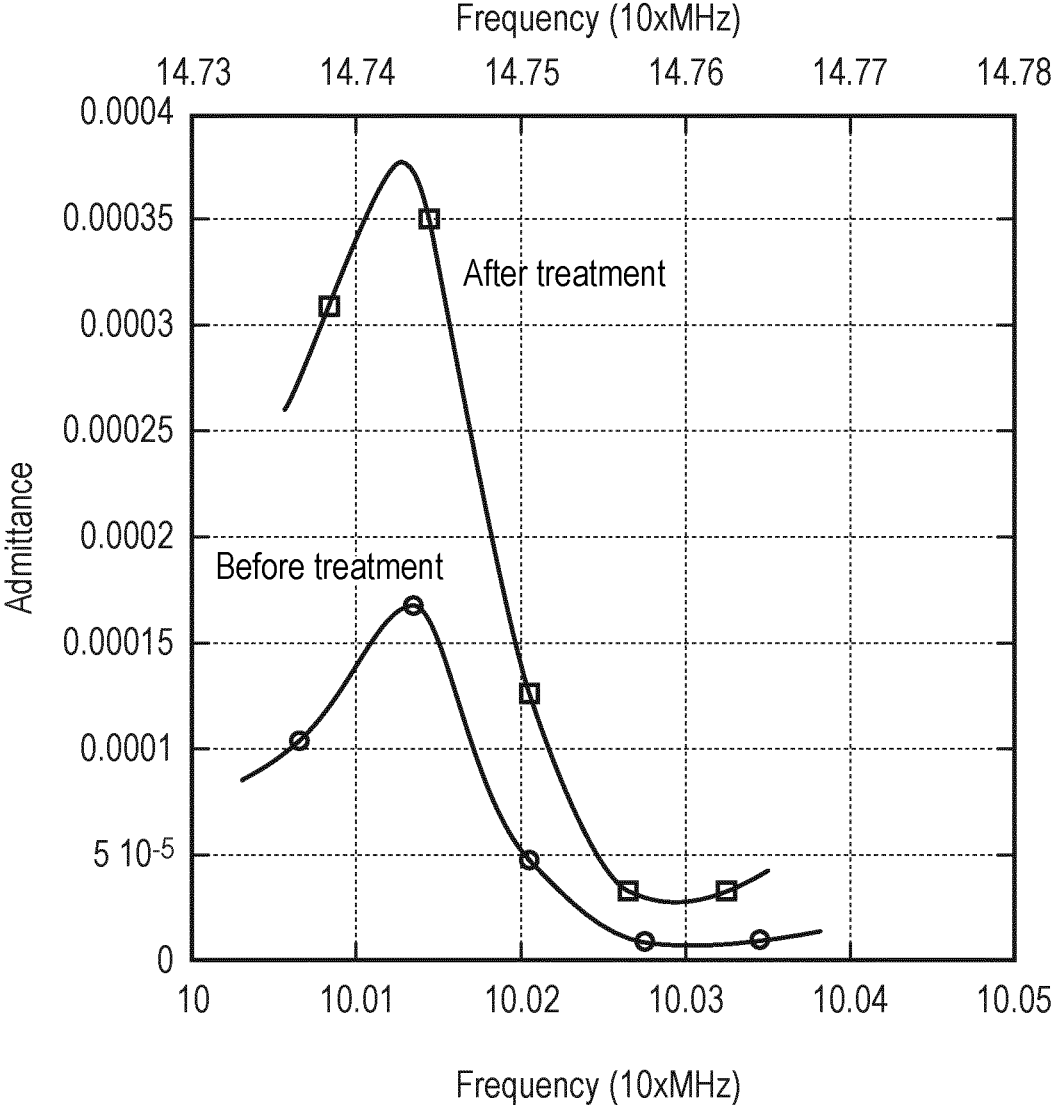
FIG. 4 shows the admittance spectrum, as measured using a vector network analyser (VNA), for a 10 MHz quartz crystal resonator, before and after the removal of hydrogen from the quartz crystal plate of the resonator.

FIG. 4 shows the admittance spectrum, as measured using a vector network analyser (VNA), for a 10 MHz quartz crystal resonator, before and after the removal of hydrogen from the quartz crystal plate of the resonator with all other measurement conditions being kept constant. The hydrogen in the quartz crystal plate can be removed using the method and system as shown above in FIGS. 2 and 3, respectively. Table 1 (below) shows the average resonant frequency and average Q factor before and after removal of hydrogen from the quartz crystal as derived from the admittance spectrum of FIG. 4. The data in Table 1 is the average measurement of the resonant frequency and Q factor for 10 quartz crystals, before and after removal of hydrogen from the quartz crystals.

TABLE 1

| Resonant frequency and Q factor (in water) before and after Hydrogen removal from quartz crystal. | | |
| --- | --- | --- |
| | Resonant Frequency $f_o$ (MHz) | Q factor (in water) |
| As received (initial) | 10.01 | 1320 |
| After Hydrogen removal | 14.74 | 1464 |
| After Hydrogen removal + 3 Months storage in ambient air | 14.74 | 1452 |

As such, the resonant frequency, under similar or identical conditions of measurement, may be increased to at least 14 MHz. Preferably, in piezoelectric resonators according to the invention, the resonant frequency may be increased by a factor of between 1.01 and 2, 3, 4 or 5, such as between 1.01 and 1.1, 1.2, 1.3, 1.4, 1.5, 1.6, 1.7, 1.8 or 1.9, for example between 1.05 and 1.5 or between 1.1 and 1.5, preferably between 1.1 and 1.4. In particular, the increase may be by a factor of approximately 1.2, or more preferably, approximately 1.4. Also preferably, in piezoelectric resonators according to the invention, the Q factor may be increased by a factor of between 1.01 and 2, 3, 4 or 5, such as between 1.01 and 1.1, 1.2, 1.3, 1.4, 1.5, 1.6, 1.7, 1.8 or 1.9, for example between 1.01, 1.02, 1.03, 1.04, 1.05, 1.06, 1.07, 1.07, 1.08, 1.09 and 1.5, preferably between 1.01 or 1.05 and 1.2. In particular, the increase may be by a factor of approximately 1.1. It should be noted here that the resonant frequency and Q factor were measured with one side of the crystal being exposed to water to simulate the use of the piezoelectric resonator as a quartz crystal microbalance in a liquid environment. The corresponding parameter values in air or vacuum for the same crystal resonator would be higher than the above-mentioned values as measured in water. However, the relative increases in resonant frequency and Q factor, being measured under the same conditions of measurement before and after hydrogen removal, are still preferably within the ranges mentioned above. Similar improvements in resonant frequency and Q factor are also observed for piezoelectric materials other than quartz where the hydrogen content of the piezoelectric materials is reduced according to the above described process, preferably to a level of 0.05 wt·ppm or less.

While the above-described example uses a quartz crystal resonator having a fundamental frequency of 10 MHz before removal of hydrogen, similar improvements can be observed in quartz crystals or other piezoelectric resonators having different fundamental frequencies. For example, the present disclosure may be applied to quartz crystals or other piezoelectric resonators having a fundamental resonant frequencies, before the removal of hydrogen of at least 5 MHz, 6 MHz, 7 MHz, 8 MHz or 9 MHz. In these examples, the resonant frequency may be improved by at least a factor of 1.2, which results in improved resonant frequencies of at least 6 MHz, 7.2 MHz, 8.4 MHz, 9.6 MHz and 10.8 MHz respectively. Alternatively, the resonant frequency may be improved by at least a factor of 1.4, which results in improved resonant frequencies of at least 7 MHz, 8.4 MHz, 9.8 MHz, 11.2 MHz and 12.6 MHz respectively.

While the fundamental frequency is the frequency of operation of the piezoelectric resonator in some applications, in some other applications, it is also possible to configure the resonator to operate at one of its overtones. Accordingly, the above-mentioned improvements to resonant frequency of a piezoelectric resonator are also observed in resonators which are configured to operate at one of the overtone frequencies, before removal of hydrogen.

As explained in FIG. 3b, before the removal of hydrogen from the quartz crystal plate, the quartz crystal plate has a hydrogen content of approximately 1.98 wt·ppm. In this case, as also explained in FIG. 1b and as can be seen in the graph of FIG. 4, the quartz crystal resonator has a resonant frequency, $f_o$, of approximately 10 MHz and a Q factor of approximately 1320. After the removal of hydrogen from the quartz crystal, in this case to a level of approximately 0.05 wt·ppm (see discussion above with respect to FIG. 3b), Table 1 shows that the resonant frequency, $f_o$, of the quartz crystal resonator is increased by approximately 50% to 14.7

MHz and the Q factor is increased by approximately 10% to 1464 (see also the spectrum in FIG. 4). That is, Table 1 and FIG. 4 shows that, by reducing the hydrogen content in the quartz crystal, an improvement in the resonant frequency, $f_o$, and Q factor of the quartz crystal resonator is achieved without requiring the thickness of the quartz crystal to be significantly altered. In practical applications, the thickness of the quartz crystal may be between 80 μm to 350 μm, and preferably around 160 μm. The thickness range, as stated for the quartz crystal having a reduced hydrogen content, is also applicable for piezoelectric materials other than quartz where the piezoelectric materials are configured to have a reduced hydrogen content.

Table 1 also shows that the resonant frequency, $f_o$, of the quartz crystal with reduced hydrogen content does not change even after storage of the crystal for three months in ambient air. In this case, the Q factor exhibits a slight decrease of 0.69% from 1464 to 1452. Nevertheless, the Q factor of the quartz crystal with reduced hydrogen content, after storage of the crystal for three months in ambient air, is still higher than the initial value of the Q factor of the crystal as received which has a relatively higher hydrogen content. Therefore Table 1 shows that the performance of the quartz crystal with reduced hydrogen content is improved and stable in that it is not significantly affected by long-term exposure to ambient air.

A quartz crystal resonator, comprising the quartz crystal plate with reduced hydrogen content, can be used in a piezoelectric sensor, such as in a QCM system for biosensor applications. For example, the improved quartz crystal resonator can be used as part of a piezoelectric sensor element in a QCM system such as the Attana Cell 200 or Attana Cell A200. A brief description of the QCM system and the sensor element comprising the quartz crystal resonator, for use in the QCM system, will be explained below in relation to FIGS. 5a and 5b.

Figure 5A:
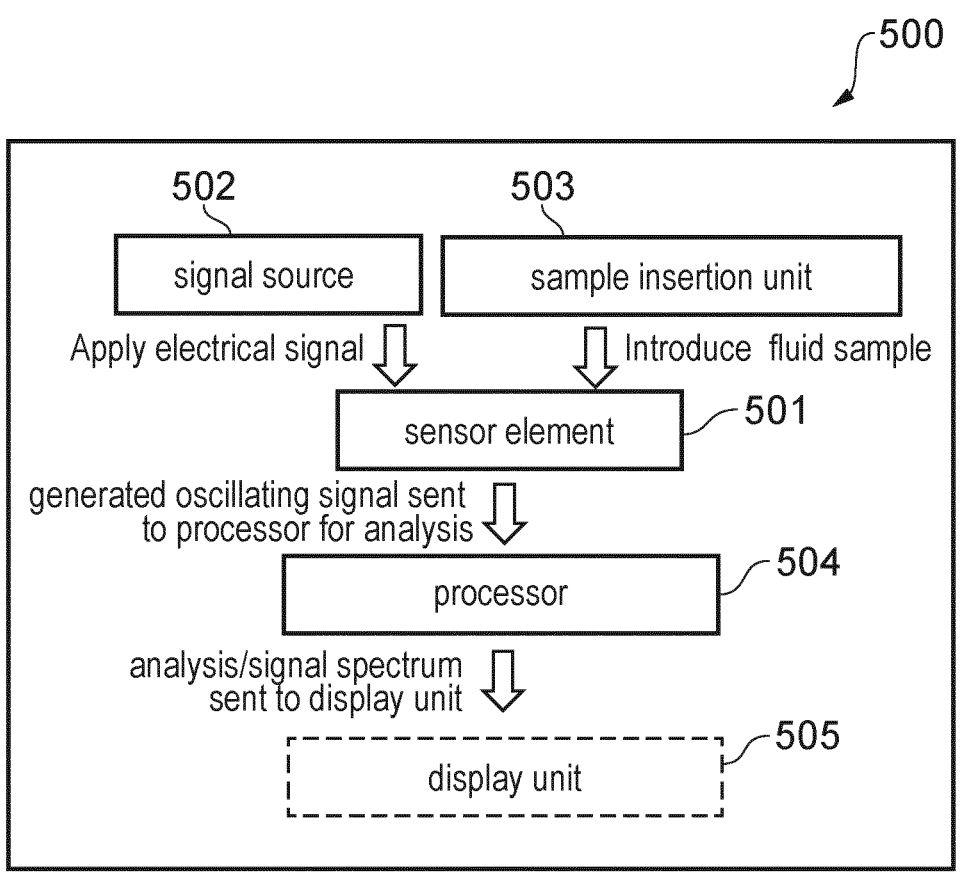
FIG. 5 shows part of a piezoelectric sensor system 500 according to a preferred embodiment of the invention.

FIG. 5a shows block diagram of the components of a QCM sensor system 500, according to an embodiment of this disclosure. The QCM sensor system 500 comprises a sensor element 501 having the improved quartz crystal resonator (not shown) of the present disclosure. The QCM system further comprises a signal source 502 for providing electric signals to the piezoelectric sensor element for generation of an oscillating motion of the quartz resonator in the sensor element 501. The QCM sensor system 500 also comprises a sample insertion unit 503 for introducing a fluid sample to the sensor element 501 and a processor 504 for determining the piezoelectric properties (including the oscillation frequencies) of the quartz resonator in the sensor element 501. The system 500 may further comprise buffer and waste containers (not shown) and signal presentation equipment 505.

FIG. 5b(i) shows a perspective view of the sensor element 501, according to an embodiment of this disclosure. FIG. 5b(ii) shows a cross-section schematic of the sensor element along the line AA' in FIG. 5b(i).

As seen in FIG. 5b(i) and FIG. 5b(ii), the sensor element 501 comprises a base component 501a which is assembled together with a lid component 501b. A detailed explanation of the assembly of the two components is provided in WO 2008/132,487.

FIG. 5b(ii) shows that the base component 501a comprises a quartz crystal plate 501e, with electrodes 501f and 501g on opposing surfaces of the quartz crystal plate 501e. In this case, the quartz crystal plate 501e, as explained earlier, is configured to have a reduced level of hydrogen for improved resonance frequency and quality factor. The quartz crystal plate 501e together with the electrodes 501f and 501g forms the quartz crystal resonator. The quartz crystal plate 501e may be configured according to the embodiment in FIG. 1a. FIG. 5b(ii) also shows a sample chamber 501h above the quartz crystal 501e where the sample chamber 501h is defined by the sample chamber ceiling 501i. During use, a fluid sample, which can contain any chemical substance of interest, is introduced by the sample insertion unit 503 (see FIG. 5a) into the sample chamber 501i of the sensor element 501 via holes or fluid channels, 501c, 501d (see FIG. 5b(i)) in the lid component 501b. The fluid channels may be configured such that one of the fluid channels, for example 501c is used for introducing the fluid sample into the sample chamber 501h and the other fluid channel, for example 501d, is used as an egress enabling the fluid sample to flow out of the sample chamber. In this way, the sample chamber may be used as a flow cell. FIG. 5b(ii) also shows a cavity 501j formed in the base component 501a under the quartz crystal plate 501e. This cavity is formed to allow for the resonance of the quartz crystal plate 501e during the use of the sensor element.

During use of the QCM sensor instrument 500, a fluid sample is introduced into the sensor element 501 by the sample insertion unit 503, as also explained above. The sample induces an interaction with the quartz crystal surface, which can in turn be observed by monitoring the oscillating characteristics of the crystal plate 501e, for example, by measuring changes in the frequency of the piezoelectric resonator comprising the quartz crystal plate 501e. The crystal plate 501e is provided with electrical contact areas (not shown) for the electrodes 501f, 501g, on its surface, such contact areas being connectable to a signal source 502 (see FIG. 5a) such as an alternating voltage source, as well as to a measurement device 504. For measuring, the piezoelectric crystal plate 501e is on one side brought into contact with the fluid (e.g. liquid) sample to be examined—for example, in FIG. 5b(ii), this surface of contact is 501g. The crystal 501e responds to the accumulation of the mass of the substance to be detected or to a change in the physical properties of the sample by altering its resonance frequency and/or oscillation amplitude.

Figure 6:
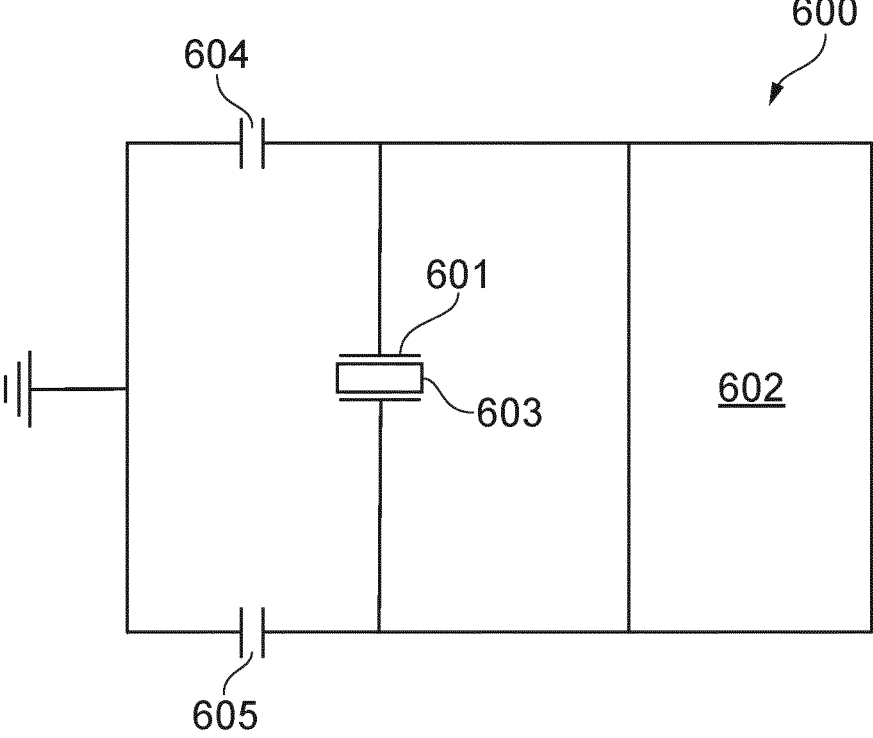
FIG. 6 shows an example schematic of a quartz crystal oscillator circuit 600 comprising the quartz crystal resonator 601 according to an embodiment the present disclosure.

FIG. 6 shows an example schematic circuit diagram of a quartz crystal oscillator circuit 600 comprising the quartz crystal resonator 601 according to an embodiment of the present disclosure. The oscillator circuit 600 can be used as, for example, a clock for an electronic circuit 602 coupled to the circuit. The quartz crystal resonator 601 comprises a quartz crystal plate 603 with reduced hydrogen for improved resonant frequency and Q factor. The circuit 600 further comprises load capacitors 604 and 605. Each capacitor is coupled between ground and a respective electrode of the quartz crystal plate 603. The load capacitors 604, 605, together with an approximation of the stray capacitance Cs of the circuit, can be used to tune the frequency of the signal generated by the circuit 600.

During operation, the circuit 600 outputs a square wave signal with a frequency which is regulated by the resonant frequency of the quartz crystal resonator 601. The square wave signal output by the quartz oscillator circuit can be used as, for example, a clock for the controlling the operation of the electronic circuit 602 coupled to the circuit. The electronic circuit 602 can be any circuit which requires a clock for controlling its operation, such as a microprocessor or a microcontroller. As described above, in this example implementation, the resonant frequency and Q factor of the quartz crystal resonator are important for controlling the frequency of the generated clock signal and the frequency stability of the clock signal, respectively. The present invention enables the resonant frequency to be increased without altering the physical characteristics, in particular the thickness, of the crystal plate. Conventionally, additional configuration of the oscillator circuit is required to generate frequencies higher than the marked value of the crystal resonator—for example, the frequency of clock signal generated by the oscillator may be typically increased using a phase-locked loop to generate a higher internal clock frequency for the electronic circuit 602 by using the low frequency clock input generated by the quartz crystal oscillator circuit 600 as a reference. However, as described above, due to the improved performance of the quartz crystal resonator of the present disclosure, a simpler oscillator circuit can be used to generate a clock signal with a high frequency without altering the dimensions of the resonator or the configuration of the circuit.

Whilst the invention is particularly useful for improving the performance of piezoelectric resonators for use in mass-sensitive chemical sensor applications, it is not limited to this application and may be equally useful for any application which implements a piezoelectric resonator. If the piezoelectric resonator, comprising the proposed piezoelectric material, is used as part of an integrated circuit, it may be encapsulated with a polymer.

Regardless of the application, it may be useful to encase the piezoelectric resonator within a casing. Such a casing may be used to prevent atmospheric gases and impurities penetrating the piezoelectric resonator. In particular, it may be important to prevent water, in the form of moisture, penetrating the resonator, because doing so may result in an increase in the resonator's hydrogen content, thereby altering its resonant frequency. Encapsulation may also prevent water adsorption on the surface (dry side) of the resonator, which would decrease the resonant frequency. It may also be important to prevent atmospheric corrosion of the piezoelectric material. The casing may be a polymer, which as noted above may be used in the case of integrated circuits. Other types of encapsulation are possible, such as metal encapsulation. Further alternatives include the use of silicon capping, or the use of hydrophobic materials.

While the piezoelectric material is defined in the embodiments to be a quartz crystal, it is not necessarily limited to this type—the proposed method for reducing hydrogen content in a piezoelectric material for improving the resonant frequency and quality factor of a resonator comprising the piezoelectric material, may be used for any type of piezoelectric material comprising hydrogen such as, for example, barium titanate, lithium niobate, zirconate titanate, aluminum nitride, zinc oxide, lithium tantalate, lithium borate, berlinite, gallium arsenide, lithium tetraborate, aluminium phosphate, bismuth germanium oxide, silicon-zinc oxide composite, dipotassium tartrate etc.

Although the description describes one example of a quartz crystal oscillator circuit comprising the proposed piezoelectric resonator (see FIG. 6), the proposed resonator can be used in other types of oscillator circuits, such as a CMOS clock, depending on application requirements. For example, the proposed resonator can be used in oscillator circuits in communication applications where the circuit can be used for providing a clock signal. In particular, the improved Q factor of the proposed resonator can improve the selectivity of a communication circuit comprising the said resonator thereby enabling improved selection over a narrower bandwidth and resulting in improved information transfer.

The present disclosure may be applied to the use of piezoelectric resonators in a number of applications. For example, the present disclosure may be applied to piezoelectric resonators used in filter applications, which may have frequencies in the range of 100 MHz to 2.5 GHz. In this case, the factor improvement to resonant frequency may be the same as those noted above; i.e. a factor 1.2 or 1.4 with respect the resonant frequency prior to hydrogen reduction.

Furthermore, the values provided for the different empirically measured parameters, throughout the description, are 'approximate' values in that the values are measured within the bounds of quality/tolerances of the measurement instrumentation.

The invention claimed is:

1. A piezoelectric resonator comprising:
a piezoelectric material, wherein the piezoelectric material is configured to have a reduced hydrogen content for increasing the shear wave velocity of the piezoelectric material, wherein the hydrogen content of the piezoelectric material is reduced to a level of approximately 0.05 wt·ppm or less;
wherein a resonant frequency of the piezoelectric resonator, comprising the piezoelectric material having the reduced hydrogen content, is increased by a factor of at least 1.2 relative to a resonant frequency of a piezoelectric resonator comprising the piezoelectric material not having a reduced hydrogen content, wherein said piezoelectric material not having a reduced hydrogen content has a hydrogen content of 1.98 wt·ppm.

2. The piezoelectric resonator according to claim 1, wherein the resonant frequency of the piezoelectric resonator, comprising the piezoelectric material having the reduced hydrogen content, when measured in water, is at least 6 MHz.

3. The piezoelectric resonator according to claim 2, wherein the resonant frequency of the piezoelectric resonator, comprising the piezoelectric material having the reduced hydrogen content, when measured in water, is at least 14 MHz.

4. The piezoelectric resonator according to claim 1, wherein the resonant frequency of the piezoelectric resonator, comprising the piezoelectric material having the reduced hydrogen content, when measured in water, is one of at least 7 MHz, 7.2 MHz, 8.4 MHz, 9.6 MHz, 9.8 MHz, 10.8 MHz, 11.2 MHz and 12.6 MHz.

5. The piezoelectric resonator according to claim 1, wherein the resonant frequency of the piezoelectric resonator, comprising the piezoelectric material having the reduced hydrogen content, is improved by a factor of at least 1.4.

6. The piezoelectric resonator according to claim 1, wherein a Q factor of the piezoelectric resonator, comprising the piezoelectric material having the reduced hydrogen content, is improved relative to a Q factor of a piezoelectric resonator comprising the piezoelectric material not having a reduced hydrogen content.

7. The piezoelectric resonator according to claim 6, wherein the Q factor of the piezoelectric resonator, comprising the piezoelectric material having the reduced hydrogen content, is improved by a factor of at least 1.1.

8. The piezoelectric resonator according to claim 6, wherein the Q factor of the piezoelectric resonator, comprising the piezoelectric material having the reduced hydrogen content, when measured in water, is at least 1450.

9. The piezoelectric resonator according to claim 1, wherein the piezoelectric material comprises a crystal plate.

10. The piezoelectric resonator according to claim 1, wherein the piezoelectric material has a thickness from 160 μm to 350 μm.

11. The piezoelectric resonator according to claim 10, wherein the piezoelectric material is a quartz crystal plate.

12. The piezoelectric resonator according to claim 1, wherein the piezoelectric resonator comprises a first electrode and a second electrode, wherein each electrode has a predetermined area and wherein the first electrode covers a first planar surface of the piezoelectric material and the second electrode covers a second planar surface of the piezoelectric material, the second planar surface being opposite to the first planar surface of the piezoelectric material.

13. The piezoelectric resonator according to claim 12, wherein each electrode partially covers the respective planar surface of the piezoelectric material.

14. The piezoelectric resonator according to claim 12, wherein the first electrode includes a first portion extending onto the second surface of the piezoelectric material.

15. The piezoelectric resonator according to claim 1, wherein the piezoelectric resonator is encapsulated.

16. The piezoelectric resonator according to claim 15, wherein the piezoelectric resonator is encapsulated in a casing, which may include one or more of: a polymer; a metal casing, a silicon cap, or a hydrophobic material.

17. A mass-sensitive chemical sensor comprising the piezoelectric resonator according to claim 1.

18. A piezoelectric sensor element for chemical analysis of a fluid sample, the sensor element comprising:
the mass-sensitive chemical sensor according to claim 17;
a sample chamber being configured to receive a fluid sample and further configured to facilitate contact of a fluid sample with the mass-sensitive chemical sensor; and
one or more flow channels in fluid connection with the sample chamber for directing the flow of the fluid sample to and from the sample chamber.

19. The piezoelectric sensor element according to claim 18, wherein the sample chamber is further configured to hold the mass-sensitive chemical sensor.

20. A piezoelectric sensor system for chemical analysis of a fluid sample, the piezoelectric sensor system comprising:
the piezoelectric sensor element according to claim 18;
a sample insertion unit for introducing the fluid sample to the sensor element;
a signal source for providing electric signals to the piezoelectric sensor element for generation of an oscillating motion of the piezoelectric resonator in the piezoelectric sensor element; and
a processing unit for measuring the resonant frequency of the piezoelectric resonator and for generating an output signal representing the said resonant frequency.

21. The piezoelectric sensor system according to claim 20, wherein the sample insertion unit is a removable unit.

22. An oscillator circuit for generating a clock signal, the oscillator circuit comprising a piezoelectric resonator according to claim 1.

23. A method for increasing the shear wave velocity of a piezoelectric material, the method comprising:
providing the piezoelectric material, the piezoelectric material having a predetermined thickness; and
removing hydrogen from the piezoelectric material;
wherein the hydrogen content of the piezoelectric material is reduced to a level of approximately 0.05 wt·ppm or less;
wherein a resonant frequency of the piezoelectric resonator, comprising the piezoelectric material having the reduced hydrogen content, is increased by a factor of at least 1.2 relative to a resonant frequency of a piezoelectric resonator comprising the piezoelectric material not having a reduced hydrogen content, wherein said piezoelectric material not having a reduced hydrogen content has a hydrogen content of 1.98 wt·ppm.

24. A piezoelectric material for a piezoelectric resonator, wherein the piezoelectric material has a reduced hydrogen content for increasing the shear wave velocity of the piezoelectric material, wherein the piezoelectric material is configured to have a hydrogen content reduced to a level of approximately 0.05 wt·ppm or less, wherein a resonant frequency of the piezoelectric resonator, comprising the piezoelectric material having the reduced hydrogen content, is increased by a factor of at least 1.2 relative to a resonant frequency of a piezoelectric resonator comprising the piezoelectric material not having a reduced hydrogen content, wherein said piezoelectric material not having a reduced hydrogen content has a hydrogen content of 1.98 wt·ppm.

\* \* \* \* \*